United States Patent
Choi et al.

(10) Patent No.: US 8,487,806 B2
(45) Date of Patent: Jul. 16, 2013

(54) VOLTAGE-TIME CONVERTERS AND TIME-DOMAIN VOLTAGE COMPARATORS INCLUDING THE SAME

(75) Inventors: Seong Hoon Choi, Seoul (KR); Jang Hyun Park, Seoul (KR); Chang Sun Kim, Seoul (KR); Jihun Eo, Gumi-si (KR); Young-Chan Jang, Gumi-si (KR)

(73) Assignees: Electronics and Telecommunications Research Institute, Daejeon (KR); Kumoh National Institute of Technology Industry-Academic Cooperation Foundation, Gumi (KR)

( * ) Notice: Subject to any disclaimer, the term of this patent is extended or adjusted under 35 U.S.C. 154(b) by 74 days.

(21) Appl. No.: 13/284,822

(22) Filed: Oct. 28, 2011

(65) Prior Publication Data

US 2012/0133540 A1    May 31, 2012

(30) Foreign Application Priority Data

Nov. 26, 2010  (KR) .................. 10-2010-0119028
Jun. 8, 2011   (KR) .................. 10-2011-0055136

(51) Int. Cl.
*H03M 1/50* (2006.01)

(52) U.S. Cl.
USPC ........... 341/166; 323/284; 327/238; 327/254; 327/261; 379/19

(58) Field of Classification Search
USPC .......... 341/166, 167, 152; 323/284; 327/238, 327/254, 261; 379/19, 98
See application file for complete search history.

(56) References Cited

U.S. PATENT DOCUMENTS

| | | | | |
|---|---|---|---|---|
| 5,440,307 A * | 8/1995 | Maier et al. | .................... | 341/152 |
| 6,271,773 B1 * | 8/2001 | Kobayashi | ....................... | 341/51 |
| 7,336,213 B2 * | 2/2008 | Gupta et al. | .................... | 341/166 |
| 7,652,604 B2 * | 1/2010 | Parayandeh et al. | .......... | 341/143 |
| 8,344,926 B2 * | 1/2013 | Decaens | ....................... | 341/161 |

* cited by examiner

*Primary Examiner* — Lam T Mai (57) ABSTRACT

Provided is a time-domain voltage comparator including a voltage-time converter. The voltage-time converter includes a conversion unit and an output unit. The conversion unit includes a first MOS transistor which shifts a voltage level of the first detection node according to an external first voltage signal, and a second MOS transistor which shifts a voltage level of the second detection node according to an external second voltage signal. The output unit generates first and second output signals in response to voltages of the first and second detection nodes. The output unit determines a shifted time of the first output signal according to a voltage level of the first detection node and determines a shifted time of the second output signal according to a voltage level of the second detection node.

14 Claims, 7 Drawing Sheets

VOLTAGE-TIME CONVERTERS AND TIME-DOMAIN VOLTAGE COMPARATORS INCLUDING THE SAME

CROSS-REFERENCE TO RELATED APPLICATIONS

This U.S. non-provisional patent application claims priority under 35 U.S.C. §119 of Korean Patent Application Nos. 10-2010-0119028, filed on Nov. 26, 2010, and 10-2011-0055136, filed on Jun. 8, 2011, the entire contents of which are hereby incorporated by reference.

BACKGROUND OF THE INVENTION

The present invention disclosed herein relates to a time-domain voltage comparator including a voltage-time converter.

Generally, analog-digital (A/D) converting devices are circuits that convert an analog signal to a digital signal, and included in main devices that are demanded in general signal processing fields as well as wireless communication fields. A/D converting devices include a voltage comparator.

Particularly, as in portable electronic devices and wireless sensor network electronic devices, a power usable by A/D converting devices are limited because a power source is dependent on a battery. As a degree of integration in electronic devices is enhanced, a voltage level supplied to the electronic devices is lowered.

If a supplied voltage is lowered, the reliability of analog circuits is largely reduced compared to digital circuits. Due to this reason, stable operations of A/D converting devices are not guaranteed.

Moreover, if a voltage comparator included in an A/D converting device directly compares the voltage levels of two voltage signals, the reliability of the voltage comparator is reduced in proportion to the decrease in a supplied voltage.

SUMMARY OF THE INVENTION

The present invention provides a voltage-time converter and a time-domain voltage comparator including the same, which occupy a small area.

Embodiments of the present invention provide a voltage-time converter including: first and second detection nodes; a conversion unit including a first MOS transistor which shifts a voltage level of the first detection node according to an external first voltage signal, and a second MOS transistor which shifts a voltage level of the second detection node according to an external second voltage signal; and an output unit generating first and second output signals in response to voltages of the first and second detection nodes, and configured to determine a shifted time of the first output signal according to a voltage level of the first detection node and determine a shifted time of the second output signal according to a voltage level of the second detection node, wherein a voltage slope of the first detection node is determined according to the voltage level of the first voltage signal, and a voltage slope of the second detection node is determined according to the voltage level of the second voltage signal.

In some embodiments, the conversion unit may further include: a third MOS transistor connected between the first MOS transistor and a ground, and turning on in response to an external clock signal to electrically connect the first MOS transistor and the ground; and a fourth MOS transistor connected between the second MOS transistor and the ground, and turning on in response to the clock signal to electrically connect the second MOS transistor and the ground.

In other embodiments, the first detection node may be pre-charged, and then the third MOS transistor may be turned on. The second detection node may be pre-charged, and then the fourth MOS transistor may be turned on.

In still other embodiments, the conversion unit may further include: a fifth MOS transistor receiving a source voltage and turning on in response to an external clock signal to pre-charge the first detection node; and a sixth MOS transistor receiving the source voltage and turning on in response to the clock signal to pre-charge the second detection node.

In even other embodiments, the output unit may include: a first inverter generating the first output signal according to the voltage of the first detection node, and shifting the first output signal when the voltage level of the first detection node reaches a predetermined threshold voltage level; and a second inverter generating the second output signal according to the voltage of the second detection node, and shifting the second output signal when the voltage level of the second detection node reaches the predetermined threshold voltage level.

In yet other embodiments, the shifted time of the first output signal may correspond to the voltage level of the first voltage signal, and the shifted time of the second output signal may correspond to the voltage level of the second voltage signal.

In other embodiments of the present invention, a time-domain voltage comparator includes: a voltage-time converter generating first and second output signals; and a detector receiving the first and second output signals, and configured to detect a previously-shifted signal and a later-shifted signal from among the first and second output signals, wherein, the voltage-time converter includes: first and second detection nodes respectively having specific voltage levels; a conversion unit including a first MOS transistor which shifts a voltage level of the first detection node according to an external first voltage signal, and a second MOS transistor which shifts a voltage level of the second detection node according to an external second voltage signal; and an output unit configured to generate a first output signal which is shifted according to the voltage level of the first detection node, and generate a second output signal which is shifted according to the voltage level of the second detection node, and a voltage slope of the first detection node is determined according to the voltage level of the first voltage signal, and a voltage slope of the second detection node is determined according to the voltage level of the second voltage signal.

In some embodiments, the detector may include: a time amplification unit amplifying a difference between a shifted time of the first output signal and a shifted time of the second output signal; and a phase detection unit detecting a previously-shifted signal and a later-shifted signal from among the first and second output signals according to an output of the time amplification unit.

In other embodiments, the detector may include: an amplification unit generating a third output signal in response to the first output signal, and generating a fourth output signal in response to the second output signal; and a phase detection unit detecting a previously-shifted signal and a later-shifted signal from among the third and fourth output signals, and a difference between a shifted time of the third output signal and a shifted time of the fourth output signal may be greater than a difference between a shifted time of the first output signal and a shifted time of the second output signal.

In still other embodiments of the present invention, a voltage-time converter includes: a first MOS transistor connected to a first detection node, and operating in response to a first voltage signal; a second MOS transistor connected to a second detection node, and operating in response to a second voltage signal; a third MOS transistor electrically connecting the first MOS transistor and a ground in response to a clock signal; a fourth MOS transistor electrically connecting the second MOS transistor and the ground in response to the clock signal; a fifth MOS transistor receiving a source voltage, and pre-charging the first detection node in response to the clock signal; and a sixth MOS transistor receiving the source voltage, and pre-charging the second detection node in response to the clock signal, wherein a voltage slope of the first detection node is determined according to a voltage level of the first voltage signal, and a voltage slope of the second detection node is determined according to a voltage level of the second voltage signal.

In some embodiments, the voltage-time converter may further include a duplication circuit including seventh to ninth MOS transistors which are sequentially connected between the source voltage and the ground, and tenth to twelfth MOS transistors which are sequentially connected between the source voltage and the ground, wherein the eighth MOS transistor operates in response to the first voltage signal, the eleventh MOS transistor operates in response to the second voltage signal, and the seventh, ninth, tenth and twelfth MOS transistors operate in response to an inverted clock signal.

In other embodiments, the voltage-time converter may further include: a thirteenth MOS transistor connected between the ground and a first node, and operating in response to a delayed clock signal; a first cross-coupled MOS transistor connected between the first detection node and the first node, and turning off in response to a voltage of the second detection node; and a second cross-coupled MOS transistor connected between the second detection node and the first node, and turning off in response to a voltage of the first detection node.

In still other embodiments, one of the first and second cross-coupled MOS transistors may be turned off, and then the delayed clock signal may be shifted. The thirteenth MOS transistor may be turned on according to the shift of the delayed clock signal.

In even other embodiments, the voltage-time converter may further include an output unit generating a first output signal which is shifted according to a voltage level of the first detection node, and generating a second output signal which is shifted according to a voltage level of the second detection node.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In this disclosure below, when one part (or element, device, etc.) is referred to as being 'connected' to another part (or element, device, etc.), it should be understood that the former can be 'directly connected' to the latter, or 'electrically connected' to the latter via an intervening part (or element, device, etc.). Furthermore, when it is described that one comprises (or includes or has) some elements, it should be understood that it may comprise (or include or has) only those elements, or it may comprise (or include or have) other elements as well as those elements if there is no specific limitation.

Figure 1:
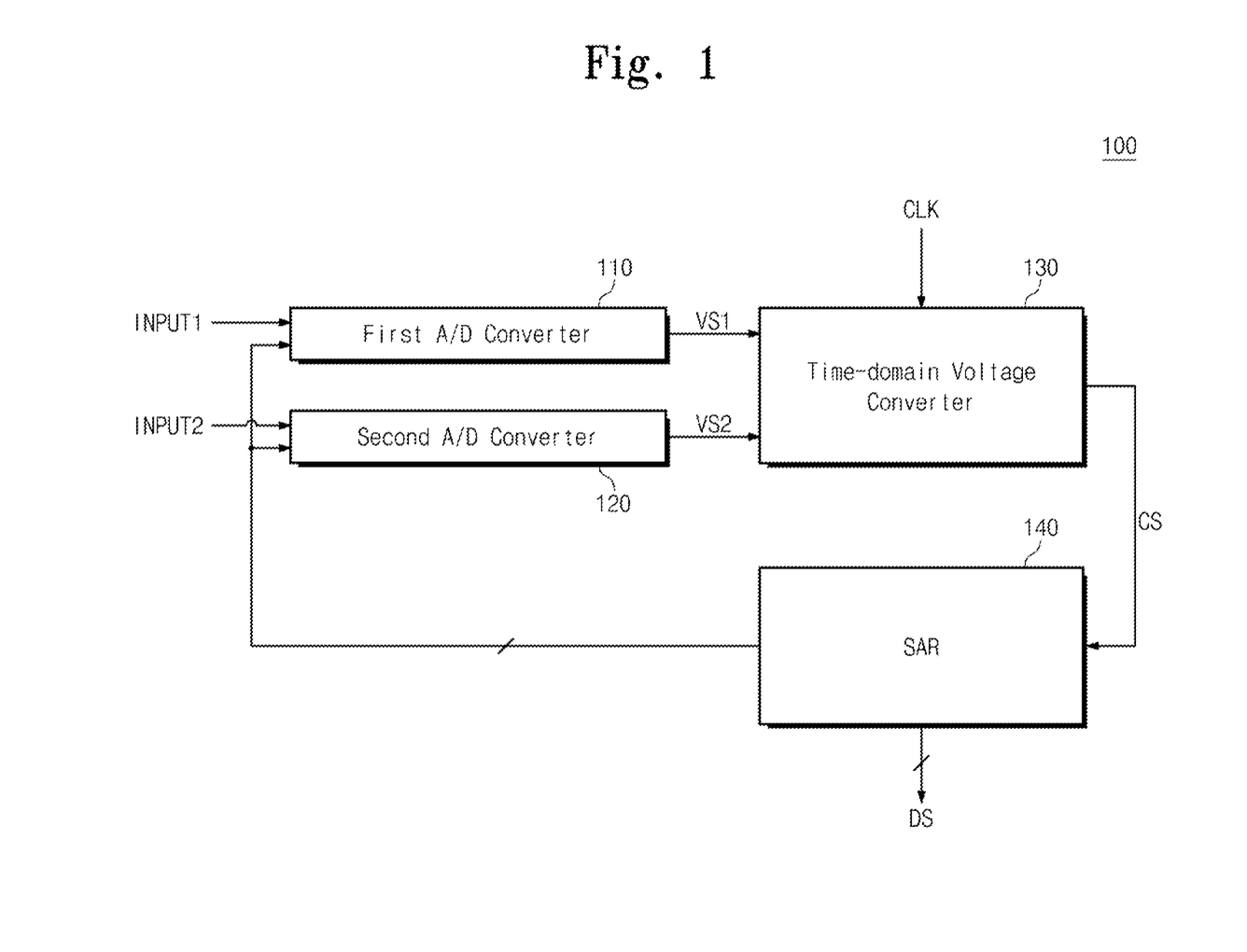
FIG. 1 is a block diagram illustrating an A/D converting device.

FIG. 1 is a block diagram illustrating an A/D converting device 100. The A/D converting device 100 outputs a digital signal DS according to first and second input signals INPUT1 and INPUT2. For example, an analog signal corresponding to a difference between voltage levels of the first and second input signals INPUT1 and INPUT2 is converted to the digital signal DS.

Referring to FIG. 1, the A/D converting device 100 includes first and second A/D converters 110 and 120, a time-domain voltage converter 130, and a Successive Approximation Register (SAR) 140.

The first and second A/D converters 110 and 120 receive the first and second input signals INPUT1 and INPUT2, respectively. The first and second input signals INPUT1 and INPUT2 are analog signals.

The first and second A/D converters 110 and 120 receive an output signal of the SAR 140. Each of the first and second A/D converters 110 and 120 converts the output signal of the SAR 140 to an analog signal.

Each A/D converter generates a voltage signal VS corresponding to a difference between a voltage level of the received input signal and a voltage level of the converted analog signal. For example, the first A/D converter 110 generates a first voltage signal VS1 corresponding to a difference between the voltage level of the first input signal INPUT1 and the voltage level of the converted analog signal. The second A/D converter 120 generates a second voltage signal VS2 corresponding to a difference between the voltage level of the second input signal INPUT2 and the voltage level of the converted analog signal.

The time-domain voltage comparator 130 receives the first voltage signal VS1 from the first A/D converter 110 and receives the second voltage signal VS2 from the second A/D converter 120. The time-domain voltage comparator 130 operates in response to a clock signal CLK. The time-domain voltage comparator 130 compares a voltage level of the first voltage signal VS1 and a voltage level of the second voltage signal VS2, and generates a comparison signal CS according to the compared result.

Specifically, the time-domain voltage comparator 130 generates the comparison signal CS according to whether the voltage level of the first voltage signal VS1 is higher or lower than the voltage level of the second voltage signal VS2. For example, when the voltage level of the first voltage signal VS1 is higher than the voltage level of the second voltage signal VS2, the time-domain voltage comparator 130 outputs a low level of comparison signal CS. When the voltage level of the second voltage signal VS2 is higher than the voltage level of the first voltage signal VS1, the time-domain voltage comparator 130 outputs a high level of comparison signal CS.

The SAR 140 determines the digital signal DS with the comparison signal CS. For example, the SAR 140 determines one bit value each time the comparison signal CS is received. It is assumed that the A/D converting device 100 outputs a 10-bit digital signal DS based on the first and second input signals INPUT1 and INPUT2. The SAR 140 may receive the comparison signal CS ten times. Whenever the comparison signal CS is received, the SAR 140 may determine one bit value of the digital signal DS. For example, the SAR 140 may sequentially determine bit values of the digital signal DS in an order from a Most Significant Bit (MSB) to a Least Significant Bit (LSB). Exemplarily, signals respectively outputted to the first and second A/D converters 110 and 120 are signals of which only values of some of the 10 bits have been determined.

Figure 2:
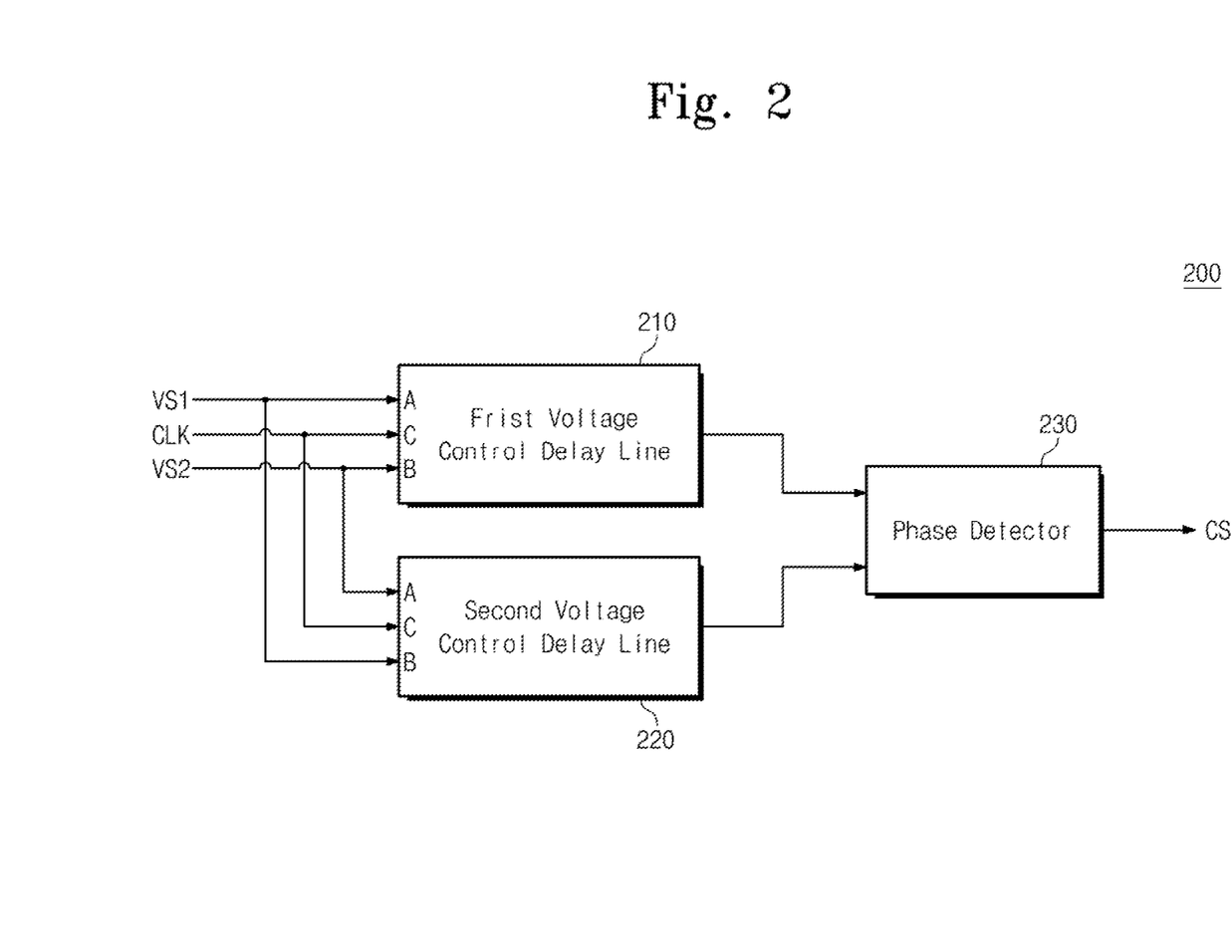
FIG. 2 is a block diagram illustrating an embodiment of a time-domain voltage comparator of FIG. 1.

FIG. 2 is a block diagram illustrating an embodiment 200 of the time-domain voltage comparator 130 of FIG. 1.

Referring to FIG. 2, the time-domain voltage comparator 200 includes a first voltage control delay line 210, a second voltage control delay line 220, and a phase detector 230.

The first voltage control delay line 210 receives a first voltage signal VS1, a clock signal CLK, and a second voltage signal VS2 through a first node A, a third node C, and a second node B, respectively. The second voltage control delay line 220 receives the second voltage signal VS2, the clock signal CLK, and the first voltage signal VS1 through a first node A, a third node C, and a second node B, respectively.

Except that the voltage signals received through the first and second nodes A and B differs from each other, the first and second voltage control delay lines 210 and 220 have the same configuration.

Timing for shifting an output signal of each voltage control delay line is determined according to whether the voltage signal received through the first node A is greater or less than the voltage signal received through the second node B.

The phase detector 230 compares an output of the first voltage control delay line 210 and an output of the second voltage control delay line 220. The phase detector 230 may generate the comparison signal CS with a time when the output of the first voltage control delay line 210 is shifted and a time when the output of the second voltage control delay line 220 is shifted.

Figure 3:
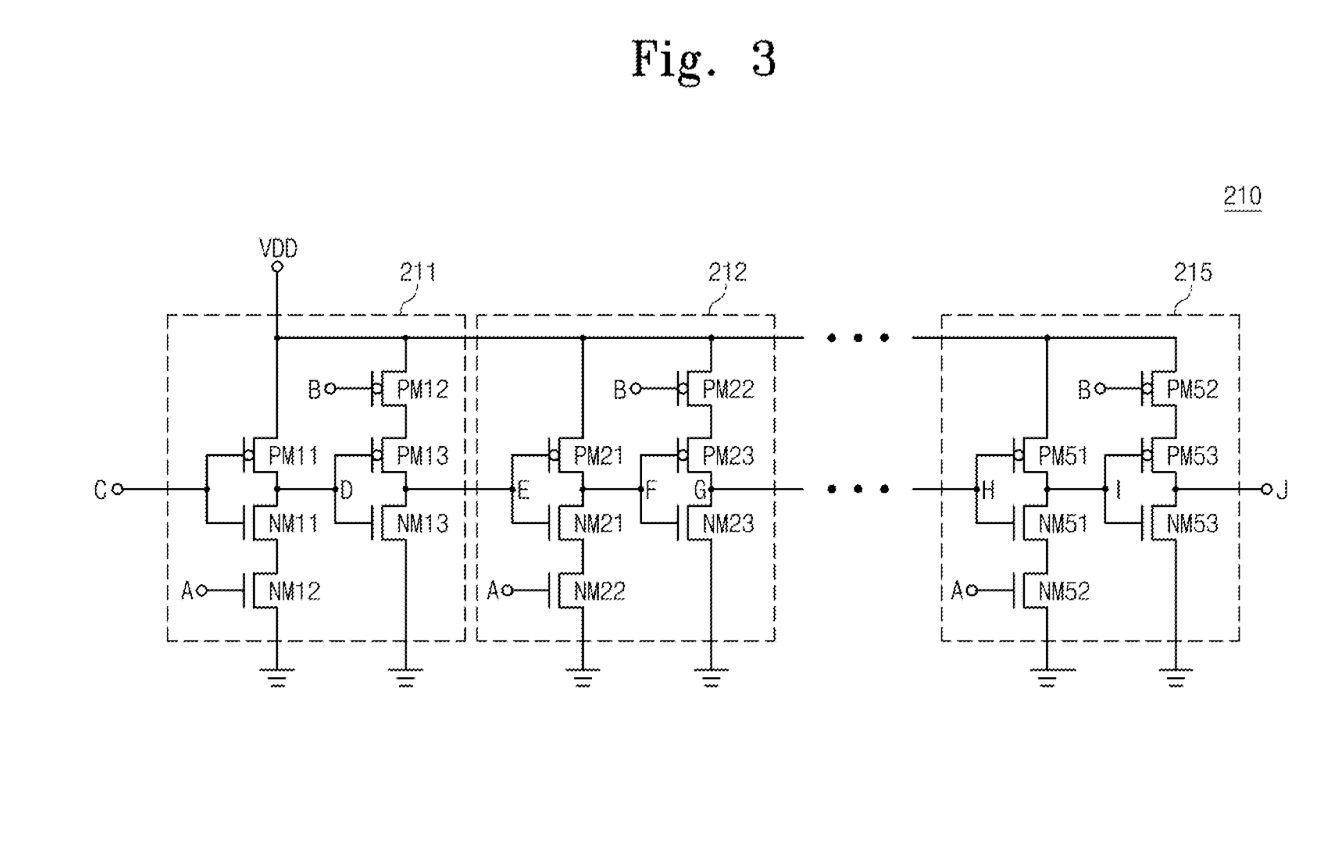
FIG. 3 is a circuit diagram specifically illustrating a first voltage control delay line.

FIG. 3 is a circuit diagram specifically illustrating the first voltage control delay line 210.

Referring to FIG. 3, the first voltage control delay line 210 includes a plurality of stages 211 to 215. The first voltage signal VS1 is provided through a first node A of each stage. The second voltage signal VS2 is provided through a second node A of each stage. Herein, the first node A is connected to an NMOS transistor, and the second node B is connected to a PMOS transistor.

When the clock signal CLK received through a third node C has a low level, a PMOS transistor PM11 is turned on, and an NMOS transistor NM11 is turned off. Therefore, a fourth node D is pre-charged. A logic state of the fourth node D is high. An NMOS transistor NM13 is turned on according to the logic state of the fourth node D, and the logic state of a fifth node E is low.

A PMOS transistor PM21 is turned on, and thus, the logic state of a sixth node F is high. An NMOS transistor NM23 is turned on, and thus, the logic state of a seventh node G is high.

As a result, when the clock signal CLK has a low level, the logic state of an input node (for example, C, E, or H) of each stage is low, and moreover, the logic state of an output node (for example, E, G, or F) of each stage is low.

A first stage 211 operates in response to the clock signal CLK. When the clock signal CLK is shifted to a high level, a difference of a time when the logic state of the fifth node E is shifted to a high level occurs according to the first voltage signal VS1 received through the first node A and the second voltage signal VS2 received through the second node B. As a voltage level of the first voltage signal VS1 becomes higher and a voltage level of the second voltage signal VS2 becomes lower, a time when a voltage of the fifth node E is shifted is early.

Except that a second stage 212 operates in response to the voltage of the fifth node E instead of the clock signal CLK, the second stage 212 is configured identically to the first stage 211. The PMOS transistor PM21 is turned off and an NMOS transistor NM21 is turned on, according to the voltage of the fifth node E. As the voltage level of the first voltage signal VS1 becomes higher and the voltage level of the second voltage signal VS2 becomes lower, a difference of a time when the logic state of the seventh node G is shifted to a high level occurs.

Likewise, when the logic state of an eighth node H of a fifth stage 215 is high, as the voltage level of the first voltage signal VS1 becomes higher and the voltage level of the second voltage signal VS2 becomes lower, a difference of a time when the logic state of a tenth node J is shifted to a high level occurs.

That is, when the logic state of an input node of each stage is high, as the voltage level of the first voltage signal VS1 becomes higher and the voltage level of the second voltage signal VS2 becomes lower, a time when a voltage of an output node of each stage is shifted is early.

As a result, when the logic state of the clock signal CLK is high, as the voltage level of the first voltage signal VS1 becomes higher and the voltage level of the second voltage signal VS2 becomes lower, a time when a voltage of the tenth node J is shifted is early. The tenth node J is an output node of the first voltage control delay line 210. The voltage of the tenth node J is supplied to the phase detector 230 (see FIG. 1).

Except that the second voltage signal VS2 is received by the first node A and the first voltage signal VS1 is received by the second node B, the second voltage control delay line 220 is configured identically to the first voltage control delay line 210. As the voltage level of the first voltage signal VS1 becomes lower and the voltage level of the second voltage signal VS2 becomes higher, a time when the output of the second voltage control delay line 220 is shifted is early.

Figure 4:
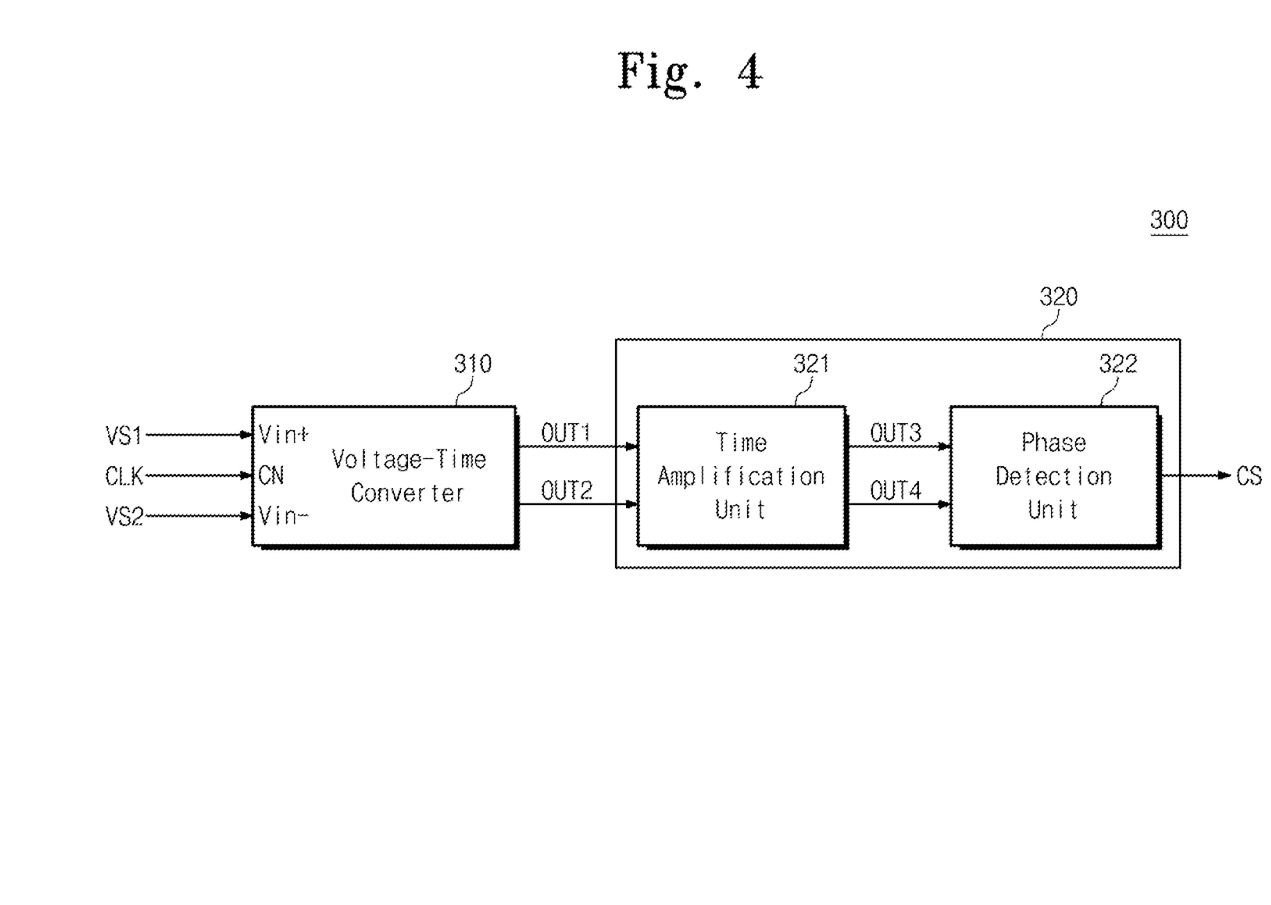
FIG. 4 is a block diagram illustrating another embodiment of the time-domain voltage comparator of FIG. 1.

FIG. 4 is a block diagram illustrating another embodiment 300 of the time-domain voltage comparator 130 of FIG. 1.

Referring to FIG. 4, the time-domain voltage comparator 130 includes a voltage-time converter 310, and a detector 320.

The voltage-time converter 310 receives the first voltage signal VS1 through a first node Vin+, and receives the second voltage signal VS2 through a second node Vin−. Furthermore, the voltage-time converter 310 receives the clock signal CLK through a clock node CN.

The voltage-time converter 310 generates first and second output signals OUT1 and OUT2 based on the first and second voltage signals VS1 and VS2. The voltage-time converter 310 determines a time when the first output signal OUT1 is shifted, according to the voltage level of the first voltage signal VS1. The voltage-time converter 310 determines a time when the second output signal OUT2 is shifted, according to the voltage level of the second voltage signal VS2. A phase difference between the first and second output signals OUT1 and OUT2 occurs.

The detector 320 receives the first and second output signals OUT1 and OUT2. The detector 320 detects a signal that is first shifted among the first and second output signals OUT1 and OUT2 and a signal is shifted later than the first-shifted signal, and outputs the comparison signal CS.

The detector 320 includes a time amplification unit 321 and a phase detection unit 322. The time amplification unit 321 amplifies a difference between times when the first and second output signals OUT1 and OUT2 are respectively shifted to generate third and fourth output signals OUT3 and OUT4. For example, when the difference between times when the first and second output signals OUT1 and OUT2 are respectively shifted is a specific time, a difference between times when the third and fourth output signals OUT3 and OUT4 are respectively shifted may be greater than the specific time.

The phase detection unit 322 detects a signal that is first shifted among the third and fourth output signals OUT3 and OUT4 and a signal is shifted later than the first-shifted signal, and outputs the comparison signal CS. That is, the phase detection unit 322 compares phases of the third and fourth output signals OUT3 and OUT4. For example, in a case where a time when the third output signal OUT3 is shifted is faster than a time when the fourth output signal OUT4 is shifted, the phase detection unit 322 generates the comparison signal CS having a low level. In a case where a time when the fourth output signal OUT4 is shifted is faster than a time when the third output signal OUT3 is shifted, the phase detection unit 322 generates the comparison signal CS having a high level. Herein, the logic state of the comparison signal CS being low denotes that the voltage level of the first voltage signal VS1 is higher than the voltage level of the second voltage signal VS2. The logic state of the comparison signal CS being high denotes that the voltage level of the first voltage signal VS1 is lower than the voltage level of the second voltage signal VS2.

As a result, the time-domain voltage converter 300 the time-domain voltage converter 300 converts the voltage level of the first voltage signal VS1 and the voltage level of the second voltage signal VS2 to time information, and determines a high level of voltage signal and a low level of voltage signal among the voltage levels of the first and second voltage signals VS1 and VS2 on the basis of the converted time information.

Figure 5:
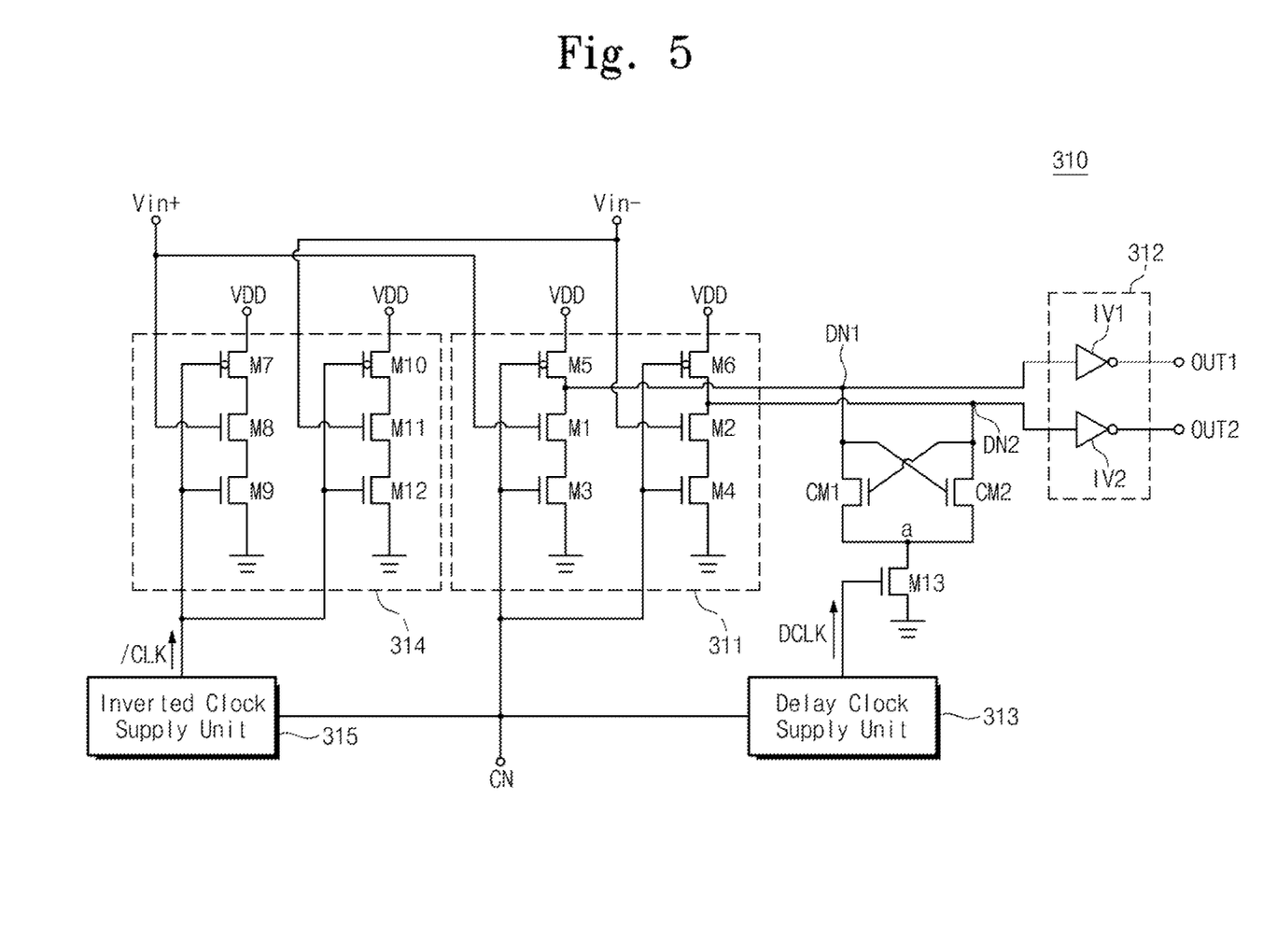
FIG. 5 is a block diagram illustrating in detail a voltage-time converter of FIG. 4.
Figure 6:
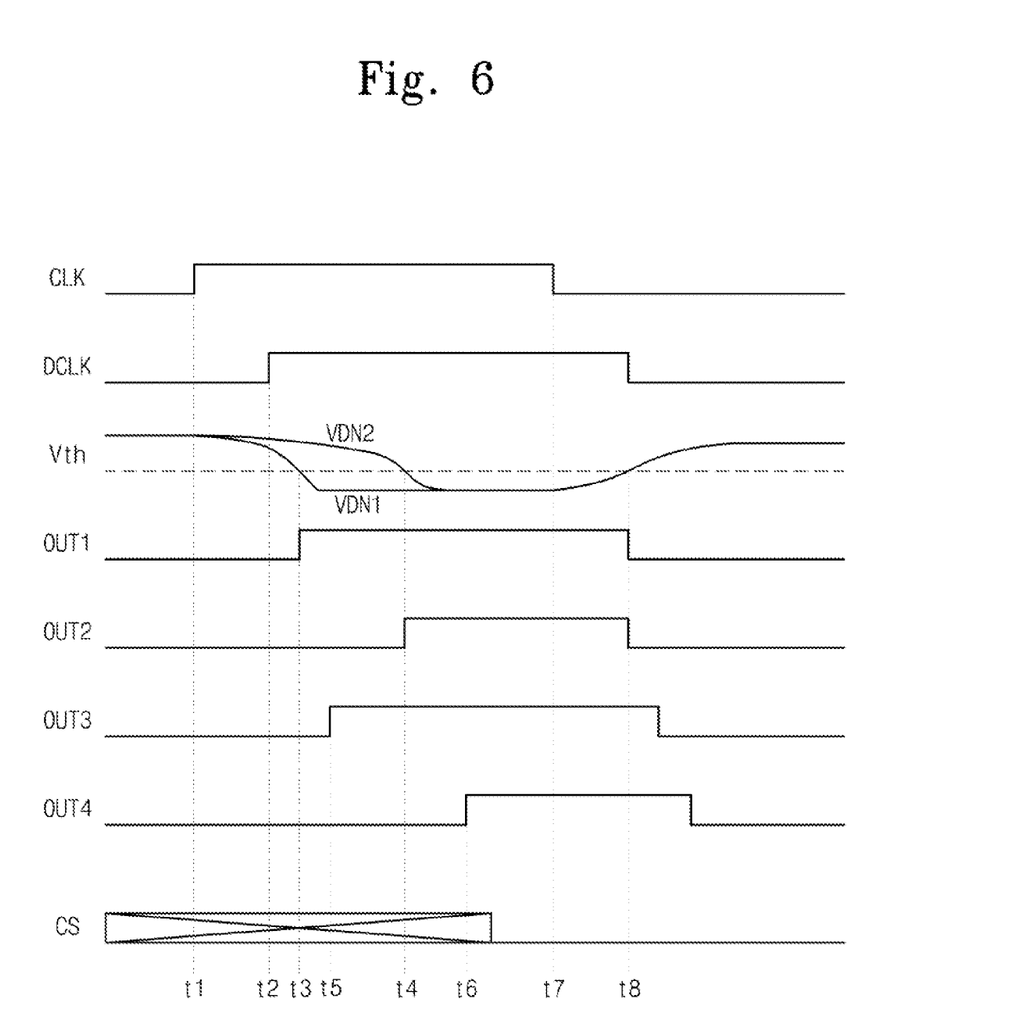
FIG. 6 is a timing diagram showing signals of the voltage-time converter of FIG. 4.
Figure 7:
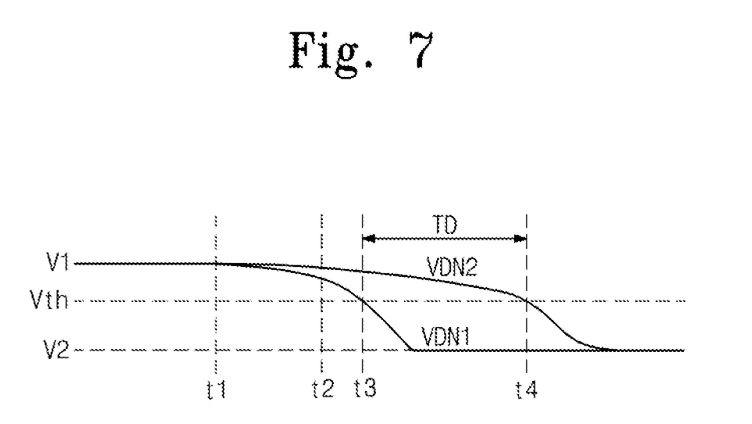
FIG. 7 is a diagram showing in detail the change of voltages at first and second detection nodes until the first and second detection nodes are pre-charged and then discharged.

FIG. 5 is a block diagram illustrating in detail the voltage-time converter 310 of FIG. 4. FIG. 6 is a timing diagram showing signals of the voltage-time converter 310 of FIG. 4. FIG. 7 is a diagram showing in detail the change of voltages at first and second detection nodes VP1 and VP2 until the first and second detection nodes VP1 and VP2 are pre-charged and then discharged. In FIGS. 6 and 7, for convenience, each signal should be understood as being schematically shown.

Referring to FIG. 5, the voltage-time converter 310 includes a conversion unit 311, an output unit 312, a delay clock supply unit 313, a duplication circuit 314, and an inverted clock supply unit 315. The voltage-time converter 310 further includes cross-coupled MOS transistors CM1 and CM2, and a thirteenth NMOS transistor M13. The conversion unit 311 includes first to sixth MOS transistors M1 to M6. The first to fourth MOS transistors M1 to M4 are NMOS transistors. The fifth and sixth MOS transistors M5 and M6 are PMOS transistors.

A gate of the first MOS transistor M1 is connected to a first node Vin+. The first MOS transistor M1 operates in response to the first voltage signal VS1 received through the first node Vin+. The first MOS transistor M1 is connected to a first detection node DN1 and the third MOS transistor M3.

A gate of the second MOS transistor M2 is connected to a second node Vin−. The second MOS transistor M2 operates in response to the second voltage signal VS2 received through the second node Vin−. The second MOS transistor M2 is connected to a second detection node DN2 and the fourth MOS transistor M4.

Gates of the third and fourth MOS transistors M3 and M4 are connected to the clock node CN. The third MOS transistor M3 is connected to the first MOS transistor M1 and a ground. The fourth MOS transistor M4 is connected to the second MOS transistor M2 and the ground.

The third and fourth MOS transistors M3 and M4 are turned on/off in response to the clock signal CLK. When the clock signal CLK has a low level, the third and fourth MOS transistors M3 and M4 are turned off. When the clock signal CLK has a high level, the third and fourth MOS transistors M3 and M4 are turned on.

Gates of the fifth and sixth MOS transistors M5 and M6 are connected to the clock node CN. The fifth MOS transistor M5 receives a source voltage and is connected to the first detection node DN1. The sixth MOS transistor M6 receives the source voltage and is connected to the second detection node DN2.

The fifth and sixth MOS transistors M5 and M6 are turned on/off in response to the clock signal CLK. When the clock signal CLK has a low level, the fifth and sixth MOS transistors M5 and M6 are turned on. When the clock signal CLK has a high level, the fifth and sixth MOS transistors M5 and M6 are turned off.

The first detection node DN1 is connected to a second cross-coupled MOS transistor CM2, and the second detection node DN2 is connected to a first cross-coupled MOS transistor CM1. The first and second cross-coupled MOS transistors CM1 and CM2 are NMOS transistors. The first cross-coupled MOS transistor CM1 is connected to the first detection node DN1 and a node 'a', and operates in response to a voltage of the second detection node DN2. The second cross-coupled MOS transistor CM2 is connected to the second detection node DN2 and the node 'a', and operates in response to a voltage of the first detection node DN1.

A thirteenth MOS transistor M13 is connected to the node 'a' and the ground. The thirteenth MOS transistor M13 operates in response to the delayed clock signal DCLK from the delay clock supply unit 313. When the delayed clock signal DLCK has a high level, the thirteenth MOS transistor M13 is turned on.

Referring to FIGS. 5 to 7, at a first time t1, when the clock signal CLK has a low level, the logic states of the first and second detection nodes DN1 and DN2 are high. That is, the fifth and sixth MOS transistors M5 and M6 are turned on according to the clock signal CLK having a low level. The first and second detection nodes DN1 and DN2 are pre-charged with a source voltage VDD. The first and second detection nodes DN1 and DN2 have a first voltage level V1 according to the pre-charge. The first voltage level V1 may be the almost same level as or slightly lower than that of the source voltage VDD.

When the clock signal CLK is shifted to a high level, the fifth and sixth MOS transistors M5 and M6 are turned off, and the third and fourth MOS transistors M3 and M4 are turned on. The voltage of the first detection node DN1 decreases according to the first voltage signal VS1, and the voltage of the second detection node DN2 decreases according to the second voltage signal VS2.

A voltage slope of the first detection node DN1 may be determined according to the voltage level of the first voltage signal VS1. The voltage slope denotes the amount of a shifted voltage based on a unit time. As the voltage level of the first voltage signal VS1 becomes higher, the voltage of the first detection node DN1 may be quickly shifted. As the voltage level of the first voltage signal VS1 becomes lower, the voltage of the first detection node DN1 may be slowly shifted.

A voltage slope of the second detection node DN2 may be determined according to the voltage level of the second voltage signal VS2. As the voltage level of the second voltage signal VS2 becomes higher, the voltage of the second detection node DN2 may be quickly shifted. As the voltage level of the second voltage signal VS2 becomes lower, the voltage of the second detection node DN2 may be slowly shifted.

Hereinafter, it is assumed that the voltage level of the first voltage signal VS1 is higher than that of the second voltage signal VS2. In FIG. 6, a falling slope of a voltage VDN1 (hereinafter referred to as a first detection node voltage) at the first detection node DN1 may be greater than that of a voltage VDN2 (hereinafter referred to as a second detection node voltage) at the second detection node DN2.

The first detection node DN1 is connected to a gate of the second cross-coupled MOS transistor CM2. The second detection node DN2 is connected to a gate of the first cross-coupled MOS transistor CM1. When the first and second detection nodes DN1 and DN2 are pre-charged, the first and second cross-coupled MOS transistors CM1 and CM2 may be turned on.

As the level of the first detection node voltage VDN1 decreases faster than that of the second detection node voltage VDN2, the second cross-coupled MOS transistor CM2 may be turned off prior to the first cross-coupled MOS transistor CM1.

Subsequently, at a second time t2, the logic state of the delayed clock signal DCLK is shifted to a high level. The thirteenth MOS transistor M13 may be turned on. For example, one of the first and second cross-coupled MOS transistors CM1 and CM2 may be turned off, and then the delayed clock signal DCLK may be shifted. Therefore, one of the first and second cross-coupled MOS transistors CM1 and CM2 may be turned off, and then the thirteenth MOS transistor M13 may be turned on.

The first cross-coupled MOS transistor CM1 and the thirteenth MOS transistor M13 are turned on, and thus, the first detection node DN1 is electrically connected to the ground through the first cross-coupled MOS transistor CM1 and the thirteenth MOS transistor M13. The level of the first detection node voltage VDN1 may decreases faster than before the second time t2. For example, electric charges accumulated at the first detection node DN1 may be discharged to the ground through the first and third MOS transistors M1 and M3, the first cross-coupled MOS transistor CM1, and the thirteenth MOS transistor M13.

The second cross-coupled MOS transistor CM2 is turned off, and thus, the second detection node DN2 may not be electrically connected to the ground through the second cross-coupled MOS transistor CM2 and the thirteenth MOS transistor M13. The level of the first detection node voltage VDN1 may decreases faster than before the second time t2. For example, electric charges accumulated at the second detection node DN2 may be discharged to the ground only through the second and fourth MOS transistors M2 and M4.

As a result, the first and second cross-coupled MOS transistors CM1 and CM2 and the thirteenth MOS transistor M13 increase a margin of a difference between the shifted time of the first detection node voltage VDN1 and the shifted time of the second detection node voltage VDN2.

As the delayed clock signal DCLK is received by the thirteenth MOS transistor M13, the margin of the difference between the shifted time of the first detection node voltage VDN1 and the shifted time of the second detection node voltage VDN2 increases.

It is assumed that the thirteenth MOS transistor M13 operates in response to the clock signal CLK instead of the delayed clock signal DCLK. The thirteenth MOS transistor M13 may be turned on before the second cross-coupled MOS transistor CM2 is turned off. The electric charges of the first and second detection nodes DN1 and DN2 pre-charged with the source voltage VDD may be discharged to the ground through the first and second cross-coupled MOS transistors CM1 and CM2 and the thirteenth MOS transistor M13. Also, the second detection node DN2 is connected to the ground through the second cross-coupled MOS transistor CM2 and the thirteenth MOS transistor M13, and thus, a falling slope of the second detection node voltage VDN2 may be greater than that of the second detection node voltage VDN2 of FIGS. 6 and 7. Therefore, when the thirteenth MOS transistor M13 operates in response to the clock signal CLK, a difference between a falling slope of the first detection node voltage VDN1 and the falling slope of the second detection node voltage VDN2 may decrease.

Referring to FIG. 5, the first and second detection nodes DN1 and DN2 are connected to the output unit 312. The first detection node DN1 is connected to a first inverter IV1, and the second detection node DN2 is connected to a second inverter IV2. The first inverter IV1 inverts the logic state of the first detection node DN1, and the second inverter IV2 inverts the logic state of the second detection node DN2. The first inverter IV1 generates the first output signal OUT1, and the second inverter IV2 generates the second output signal OUT2.

Referring again to FIGS. 6 and 7, at a third time t3, the level of the first detection node voltage VDN1 reaches a threshold voltage Vth. The logic state of the first output signal OUT1 is shifted from a low level to a high level. When the level of the first detection node voltage VDN1 decreases to reach the threshold voltage Vth, the logic state of the first output signal OUT1 is shifted from a low level to a high level.

At a fourth time t4, the level of the second detection node voltage VDN2 reaches the threshold voltage Vth. The logic state of the second output signal OUT2 is shifted from a low level to a high level. When the level of the second detection node voltage VDN2 decreases to reach the threshold voltage Vth, the logic state of the second output signal OUT2 is shifted from a low level to a high level. The first output signal OUT1 is shifted, and after a specific time TD has elapsed, the second output signal OUT2 is shifted.

A time when the first output signal OUT1 is shifted and a time when the second output signal OUT2 is shifted may correspond to the voltage level of the first voltage signal VS1 and the voltage level of the second voltage signal VS2, respectively.

The first and second output signals OUT1 and OUT2 are transferred to the time amplification unit 321 (see FIG. 4). The time amplification unit 321 generates the third and fourth output signals OUT3 and OUT4. In FIG. 6, the third output signal OUT3 is shifted at a fifth time t5, and the fourth output signal OUT4 is shifted at a sixth time t6.

The time amplification unit 321 amplifies a difference between the shifted time of the first output signal OUT1 and the shifted time of the second output signal OUT2. As the difference between the shifted time of the first output signal OUT1 and the shifted time of the second output signal OUT2 is amplified, a larger time margin is secured.

A difference, outputted from the time amplification unit 321, between the shifted time of the third output signal OUT3 and the shifted time of the fourth output signal OUT4 may be greater than the difference between the shifted time of the first output signal OUT1 and the shifted time of the second output signal OUT2. That is, a difference between the fifth time t5 and the sixth time t6 may be greater than a difference between the third time t3 and the fourth time t4. Accordingly, the reliability of the phase detection unit 322 (see FIG. 4) can be enhanced.

Exemplarily, the time amplification unit 321 may determine a previously-shifted signal and a later-shifted signal from among the first and second output signals OUT1 and OUT2. Furthermore, the time amplification unit 321 may delay the shifted time of the previously-shifted signal more than the later-shifted signal.

For example, the time amplification unit 321 may shift a phase of the later-shifted signal more than that of the previously-shifted signal. In FIG. 6, the shifted time of the third output signal OUT3 is slower than the shifted time of the first output signal OUT1 by a difference between the third time t3 and the fifth time t5, and the shifted time of the fourth output signal OUT4 is slower than the shifted time of the second output signal OUT2 by a difference between the fourth time t4 and the sixth time t6. In this case, the difference between the fourth time t4 and the sixth time t6 is greater than the difference between the third time t3 and the fifth time t5.

The phase detection unit 322 detects the phases of the third and fourth output signals OUT3 and OUT4. The phase detection unit 322 determines a previously-shifted signal and a later-shifted signal from among the third and fourth output signals OUT3 and OUT4. The comparison signal CS is generated according to the determined result. For example, as shown in FIG. 6, when the third output signal OUT3 is shifted previously, the logic state of the comparison signal CS may be low. On the other hand, unlike in FIG. 6, when the fourth output signal OUT4 is shifted previously, the logic state of the comparison signal CS may be high.

At a seventh time t7, the clock signal CLK is shifted to a low level. The fifth and sixth MOS transistors M5 and M6 are turned on, and the third and fourth MOS transistors M5 and M6 are turned off. The first detection node DN1 receives the source voltage VDD through the fifth MOS transistor M5, and the second detection node DN2 receives the source voltage VDD through the sixth MOS transistor M6. The voltages of the first and second detection nodes DN1 and DN2 increase.

At an eighth time t8, the clock signal CLK is shifted to a low level. The thirteenth MOS transistor M13 is turned on.

The voltage-time converter 310 includes the duplication circuit 314. The duplication circuit 314 includes seventh to twelfth MOS transistors M7 to M12. The seventh and twelfth MOS transistors M7 and M10 are PMOS transistors. The eighth, ninth, eleventh, and twelfth MOS transistors M8, M9, M11, and M12 are NMOS transistors.

The eighth MOS transistor M8 operates in response to the first voltage signal VS1 that is received through the first node Vin+. The eleventh MOS transistor M11 operates in response to the second voltage signal VS2 that is received through the second node Vin−. The seventh, ninth, tenth and twelfth MOS transistors M7, M9, M10 and M12 operate in response to an inverted clock signal /CLK that is received from the inverted clock supply unit 315.

It is assumed that the voltage-time converter 310 does not include the duplication circuit 314. The first and second voltage signals VS1 and VS2 may include noise. For example, due to the shift of the clock signal CLK, noise may occur in the first and second voltage signals VS1 and VS2. For example, due to clock feed through, noise may occur in the first and second voltage signals VS1 and VS2.

For example, due to a parasitic capacitor between the third and first MOS transistors M3 and M1 and a parasitic capacitor between the fifth and first MOS transistors M5 and M1, noise may occur in the first voltage signal VS1 when the clock signal CLK is shifted. As another example, due to a parasitic capacitor between the fourth and second MOS transistors M4 and M2 and a parasitic capacitor between the sixth and second MOS transistors M6 and M2, noise may occur in the second voltage signal VS2 when the clock signal CLK is shifted.

According to an embodiment of the present invention, in order for noise not to occur in the first and second voltage signals VS1 and VS2 due to the clock signal CLK, the inverted clock signal /CLK is supplied to the duplication circuit 314.

Except that the duplication circuit 314 receives the inverted clock signal /CLK and is not connected to the first and second detection nodes DN1 and DN2, the duplication circuit 314 is configured identically to the conversion unit 311. Noise occurring by the clock signal CLK may be offset to noise occurring by the inverted clock signal /CLK. For example, identically to that parasitic capacitors exist in the conversion unit 311, parasitic capacitors may exist even in the duplication circuit 314. By supplying the inverted clock signal /CLK to the duplication circuit 314, noise occurring by the parasitic capacitors of the conversion unit 311 may be offset to noise occurring by the parasitic capacitors of the duplication circuit 314. That is, by supplying the inverted clock signal /CLK to the duplication circuit 314, the duplication circuit 314 may receive the first and second voltage signals VS1 and VS2 from which noises have been respectively removed.

The number of MOS transistors included in the voltage-time converter 310, which have been described above with reference to FIGS. 5 to 7, is less than the number of MOS transistors included in the first voltage control delay line 210 that have been described above with reference to FIG. 3. According to the embodiment of the present invention that has been described above with reference to FIGS. 5 to 7, provided is the voltage-time converter 310 occupying a small area.

According to the embodiments of the present invention, provided are a voltage-time converter and a time-domain voltage comparator including the same, which occupy a small area.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A voltage-time converter comprising:
   first and second detection nodes;
   a conversion unit comprising a first MOS transistor which shifts a voltage level of the first detection node according to a first voltage signal from an external, and a second MOS transistor which shifts a voltage level of the second detection node according to a second voltage signal from the external; and an output unit generating first and second output signals in response to voltages of the first and second detection nodes, respectively, and configured to determine a shifted time of the first output signal according to a voltage level of the first detection node and to determine a shifted time of the second output signal according to a voltage level of the second detection node, wherein a voltage slope of the first detection node is determined according to the voltage level of the first voltage signal, and a voltage slope of the second detection node is determined according to the voltage level of the second voltage signal.

2. The voltage-time converter of claim 1, wherein the conversion unit further comprises:

a third MOS transistor coupled between the first MOS transistor and a ground, and turning on in response to an external clock signal to electrically connect the first MOS transistor and the ground; and a fourth MOS transistor coupled between the second MOS transistor and the ground, and turning on in response to the clock signal to electrically connect the second MOS transistor and the ground.

3. The voltage-time converter of claim 2, wherein, the first detection node is pre-charged, and then the third MOS transistor is turned on, and the second detection node is pre-charged, and then the fourth MOS transistor is turned on.

4. The voltage-time converter of claim 2, wherein the conversion unit further comprises:

a fifth MOS transistor receiving a source voltage and turning on in response to an external clock signal to pre-charge the first detection node; and a sixth MOS transistor receiving the source voltage and turning on in response to the clock signal to pre-charge the second detection node.

5. The voltage-time converter of claim 1, wherein the output unit comprises:

a first inverter generating the first output signal according to the voltage of the first detection node, and shifting the first output signal when the voltage level of the first detection node reaches a predetermined threshold voltage level; and a second inverter generating the second output signal according to the voltage of the second detection node, and shifting the second output signal when the voltage level of the second detection node reaches the predetermined threshold voltage level.

6. The voltage-time converter of claim 1, wherein, the shifted time of the first output signal corresponds to the voltage level of the first voltage signal, and the shifted time of the second output signal corresponds to the voltage level of the second voltage signal.

7. A time-domain voltage comparator comprising:

a voltage-time converter generating first and second output signals; and a detector receiving the first and second output signals, and configured to detect a previously-shifted signal and a later-shifted signal from among the first and second output signals, wherein the voltage-time converter comprises:

first and second detection nodes respectively having specific voltage levels;

a conversion unit comprising a first MOS transistor which shifts a voltage level of the first detection node according to a first voltage signal from an external, and a second MOS transistor which shifts a voltage level of the second detection node according to a second voltage signal from the external;

an output unit configured to generate a first output signal which is shifted according to the voltage level of the first detection node, and generate a second output signal which is shifted according to the voltage level of the second detection node, and a voltage slope of the first detection node is determined according to the voltage level of the first voltage signal, and a voltage slope of the second detection node is determined according to the voltage level of the second voltage signal.

8. The time-domain voltage comparator of claim 7, wherein the detector comprises:

a time amplification unit amplifying a difference between a shifted time of the first output signal and a shifted time of the second output signal; and a phase detection unit detecting a previously-shifted signal and a later-shifted signal from among the first and second output signals according to an output of the time amplification unit.

9. The time-domain voltage comparator of claim 7, wherein, the detector comprises:

an amplification unit generating a third output signal in response to the first output signal, and generating a fourth output signal in response to the second output signal;

a phase detection unit detecting a previously-shifted signal and a later-shifted signal from among the third and fourth output signals, and a difference between a shifted time of the third output signal and a shifted time of the fourth output signal is greater than a difference between a shifted time of the first output signal and a shifted time of the second output signal.

10. A voltage-time converter comprising:

a first MOS transistor coupled to a first detection node, and operating in response to a first voltage signal;

a second MOS transistor coupled to a second detection node, and operating in response to a second voltage signal;

a third MOS transistor electrically connecting the first MOS transistor and a ground in response to a clock signal;

a fourth MOS transistor electrically connecting the second MOS transistor and the ground in response to the clock signal;

a fifth MOS transistor receiving a source voltage, and pre-charging the first detection node in response to the clock signal; and a sixth MOS transistor receiving the source voltage, and pre-charging the second detection node in response to the clock signal, wherein a voltage slope of the first detection node is determined according to a voltage level of the first voltage signal, and a voltage slope of the second detection node is determined according to a voltage level of the second voltage signal.

11. The voltage-time converter of claim 10, further comprising a duplication circuit comprising seventh to ninth MOS transistors which are sequentially connected between the source voltage and the ground, and tenth to twelfth MOS transistors which are sequentially connected between the source voltage and the ground, wherein
- the eighth MOS transistor operates in response to the first voltage signal,
- the eleventh MOS transistor operates in response to the second voltage signal, and
- the seventh, ninth, tenth and twelfth MOS transistors operate in response to an inverted clock signal.

12. The voltage-time converter of claim 11, further comprising:
- a thirteenth MOS transistor connected between the ground and a first node, and operating in response to a delayed clock signal;
- a first cross-coupled MOS transistor connected between the first detection node and the first node, and turning off in response to a voltage of the second detection node; and
- a second cross-coupled MOS transistor connected between the second detection node and the first node, and turning off in response to a voltage of the first detection node.

13. The voltage-time converter of claim 12, wherein,
- one of the first and second cross-coupled MOS transistors is turned off, and then the delayed clock signal is shifted, and
- the thirteenth MOS transistor is turned on according to the shift of the delayed clock signal.

14. The voltage-time converter of claim 10, further comprising an output unit generating a first output signal which is shifted according to a voltage level of the first detection node, and generating a second output signal which is shifted according to a voltage level of the second detection node.

* * * * *